United States Patent

Dreifus et al.

[11] Patent Number: 5,838,089
[45] Date of Patent: Nov. 17, 1998

[54] ACOUSTIC WAVE DEVICES ON DIAMOND WITH AN INTERLAYER

[75] Inventors: David L. Dreifus, Durham; Joseph S. Holmes, Sanford, both of N.C.

[73] Assignee: Kobe Steel USA Inc., Research Triangle Park, N.C.

[21] Appl. No.: 802,272

[22] Filed: Feb. 18, 1997

[51] Int. Cl.⁶ ............................. H03H 9/25; H01L 41/18
[52] U.S. Cl. ................................ 310/313 A; 310/313 R
[58] Field of Search ........................... 310/313 R, 313 A

[56] References Cited

U.S. PATENT DOCUMENTS

| | | | |
|---|---|---|---|
| 4,952,832 | 8/1990 | Imai et al. | 310/313 A |
| 5,160,869 | 11/1992 | Nakahata et al. | 310/313 A |
| 5,221,870 | 6/1993 | Nakahata et al. | 310/313 A |
| 5,235,233 | 8/1993 | Yamamoto | 310/313 A |
| 5,320,865 | 6/1994 | Nakahata et al. | 427/100 |
| 5,329,208 | 7/1994 | Imai et al. | 310/313 R |
| 5,446,439 | 8/1995 | Nakahata et al. | 310/313 A |
| 5,565,724 | 10/1996 | Hachigo et al. | 310/313 A |
| 5,576,589 | 11/1996 | Dreifus et al. | 310/313 A |

FOREIGN PATENT DOCUMENTS

| | | | |
|---|---|---|---|
| 53-148259 | 12/1978 | Japan | 310/313 A |
| 5-95249 | 4/1993 | Japan | 310/313 R |
| 2 069 278 | 8/1981 | United Kingdom | 310/313 A |

*Primary Examiner*—Thomas M. Dougherty

[57] ABSTRACT

Embedded IDT electrodes are provided in a multilayer structure consisting of a diamond layer on a substrate with IDT electrodes formed on the diamond and a very thin interlayer covering the interdigitated transducer structure and the diamond, thus embedding the IDT electrodes between the diamond layer and the interlayer, with a piezoelectric layer on the interlayer so that an acoustic surface wave propagates in the diamond layer. The very thin interlayer between the diamond and the piezoelectric layer greatly increases the uniformity of the piezoelectric layer but does not interfere with the acoustic properties of a SAW device.

28 Claims, 6 Drawing Sheets

ACOUSTIC WAVE DEVICES ON DIAMOND WITH AN INTERLAYER

FIELD OF THE INVENTION

The present invention relates to the field of surface acoustic wave devices and more particularly to such devices which are formed on diamond or diamond-like carbon layers or films.

BACKGROUND OF THE INVENTION

Diamond is a preferred material for acoustic wave devices because it has properties which are superior to conventional acoustic wave materials and diamond-based, surface acoustic wave (SAW) devices exploit the union of microelectronics and piezoelectricity. Diamond possesses a combination of properties such as a low coefficient of thermal expansion, high mechanical hardness, large thermal conductivity, and high Young's modulus, that are uniquely suited for acoustic applications. In fact, diamond diaphragms have already been used in commercial audio speakers produced using a technique which utilizes a rotating susceptor and curved filaments in a hot filament CVD reactor to form the speaker diaphragms. These free-standing diamond structures can be purchased commercially and have been shown to exhibit a superior frequency response as compared to traditional diaphragms. The requirements of communication systems continue to drive the demand for higher frequency devices. Conventional SAW devices, however, are limited by the SAW propagation velocity, $v_{SAW}$. Typical SAW velocities of common piezoelectric materials, such as $AlPO_4$, $LiNbO_3$, $LiTaO_3$, and $SiO_2$ are of the order of 3,000 to 4,000 m/s. Higher SAW velocities have been obtained for multilayer composites ZnO/diamond and AlN/diamond multilayers. These new multilayers, with higher SAW propagation velocities offer substantial improvements in temperature stability and frequency performance well into the GHz frequency range.

The field of microacoustics, which was begun in the late 1960s, has emerged as a new technical field that has helped to improve the transmission of wideband signals. Within the past 10 years the number of device structures and applications has grown tremendously. Present-day commercial devices used in communications include delay lines and filters for 10 MHz to 4.4 GHz, resonators, multiplexers, antenna duplexers, harmonic devices, chirp filters for pulse compression, acoustic charge transport devices, oscillators, and frequency synthesizers. In addition, since SAW devices have a high density of acoustic energy in the near-surface region, they can be used as extremely sensitive probes of the physical characteristics of that region. SAW structures are used as gas and vapor, pressure, temperature, chemical, and flow sensors. Such devices are typically fabricated using silicon together with microelectronic processing techniques, and are relatively light in weight, small in size, and known for being mechanically robust.

SAW devices typically consist of interdigital transducer (IDT) metal electrodes together with a piezoelectric medium for wave generation and a medium for wave propagation, which latter medium can also be the piezoelectric medium itself. Piezoelectricity is the coupling between elastic deformation and electric polarization in certain non-centrosymmetric crystals, such as quartz, lithium niobate, aluminum nitride, and zinc oxide. Important criteria for the selection of SAW materials include the orientation or "cut" of the piezoelectric crystal, the electromechanical or piezoelectric coupling coefficient ($k^2$), the SAW propagation velocity, $v_{SAW}$, the frequency temperature coefficient (FTC), and the ease of fabrication. In most cases the orientation of the crystal determines the SAW propagation properties. Although $LiNbO_3$ and $LiTaO_3$ exhibit good piezoelectric coupling, they have high temperature sensitivities. Quartz exhibits a first order FTC of zero, however it possesses a relatively low value of $k^2$. The basic SAW filter is comprised of thin film voltage-excited input and output IDTs. Thin metal electrodes are in mechanical contact with a surface of a piezoelectric material. Time-varying electric fields between adjacent electrodes convert the input voltage signal into SAWs. To recover the output signal, the same process, operating in reverse, induces the filtered signal onto the output IDT. The filter center frequency depends on the feature size and the spacing between the periodic array of IDT metal electrodes. In some designs, the spacing of $\lambda_0/4$ (where $\lambda_0$ is the acoustic wavelength), corresponds to a center frequency of $f_0 = v_{SAW}/\lambda_0$. For such a design, an IDT spacing of 0.4 $\mu$m will be required to achieve a center frequency of 5 GHz for a device fabricated using $LiNbO_3$, whose $v_{SAW}$ is approximately 4000 meters per second. A comparison of the various materials is listed in Table I. In this table $\epsilon_{LF}$ is the low frequency permeability of the material, $\epsilon_0$ is the permeability of free space, $V_{saw}$ is the surface acoustic wave velocity, $K^2$ is the electromechanical coupling coefficient, and FTC is the frequency temperature coefficient.

TABLE I

Comparison of properties of surface acoustic wave materials.

| Material | $V_{SAW}$ (m/s) | $k^2$ (%) | FTC (ppm/ K) | $\epsilon_{LF}/\epsilon_0$ |
|---|---|---|---|---|
| Quartz-ST | 3493.9 | 0.17 | 0 | 4.56 |
| $LiNbO_3$ | 4003.6 | 5.57 | −72 | 55.19 |
| $LiTaO_3$ | 3423.8 | 1.52 | −49 | 48.25 |
| GaAs | <2841 | <0.06 | −35 | 13.1 |
| $AlPO_4$ | 3060.6 | 0.86 | ~0 | 6.04 |
| ZnO/glass | 2600 | 1–3 | −28 | 8.55-ZnO 3.75-glass |
| ZnO/AlN/glass | 5840 | 4.37 | −21 | 8.55-ZnO 12.6-AlN |
| ZnO/diamond/Si | 10,200 | 1–4.8 | −28 | 8.55-ZnO 5.7-diamond |

Submicron, finely interdigitated metal electrodes that traverse hundreds of microns can suffer from migration problems that lead to short circuits forming in the device. Long term reliability of submicron SAW devices is expected to become more of a concern as the feature size is reduced below 0.4 microns. Although the use of harmonics for higher frequency operation has been suggested, the magnitude of the signals would be significantly attenuated as compared to the fundamental frequency of the filter. Thus the phase velocity ultimately determines the upper frequency limit of SAW device operation.

Diamond is the best material from which high frequency SAW devices can be made as, may be seen from the properties listed in Table I. Although diamond is a cubic material and thus does not exhibit a piezoelectric effect, it can be coupled with piezoelectric materials in layered structures to form SAW devices. Diamond exhibits the largest acoustic velocities of any material. Although the surface orientation will affect the absolute values of acoustic wave propagation, on average, longitudinal waves propagate at 18,000 m/s, shear waves at 12,000 m/s, and surface acoustic waves at 11,000 m/s. The SAW velocity in diamond is about three times higher than those in LiNbO$_3$. A 2.5 Gigahertz device using diamond a $\lambda_0/4$ design would require a one micron line and spacing geometry. Thus larger feature sizes can be used with diamond to fabricated devices that operate at frequencies in excess of 2.5 GHz which would require 0.25–0.5 micron feature sizes in devices fabricated from conventional SAW materials. Since the feature size of diamond-based devices can be larger than in other materials, current IDT feature sizes can be used, and advanced lithography tools are not be required for device fabrication, and metal migration effects are thus minimized in high frequency SAW devices. The ability to fabricate devices that can operate at frequencies in excess of 1 GHz without requiring submicron technology greatly increases yield and quality and decreases concomitant manufacturing costs.

SAW filter devices have been demonstrated using chemical vapor deposited (CVD) diamond, and diamond will be the most attractive material both for current telecommunications needs and for future personal communications systems. Demonstrated characteristics of prototype devices indicate that SAW devices are a promising application for CVD diamond. Other materials such as AlN, GaN, and SiC may also be competitive in the near term. Although GaAs has a low SAW velocity of ~2800 m/s, there has been some interest generated in fabricating integrated microelectronic, optoelectronic, and microacoustic devices with GaAs. In addition, GaAs and other III–V active electronic devices are being currently being used in the GHz frequency range. Obtaining low-cost, large-area, and well controlled mirror-smooth surfaces will ultimately determine the usefulness of diamond SAW devices.

Many patents describe SAW filters with different arrangements and different piezoelectrics deposited on diamond. Other structures for resonators, convolvers, and phase shifters have also been disclosed. In particular, Yamamoto, in U.S. Pat. No. 5,235,233, entitled "SURFACE ACOUSTIC WAVE DEVICE" discloses the use of an SiO$_2$ film between a diamond crystal and an AlN thin film to produce a SAW device which has a high electromechanical coupling coefficient and a high phase velocity. Yamamoto mentions that the SiO$_2$ film is of sufficiently small thickness that it doesn't have an influence on the SAW characteristics of the device. Yamamoto further discloses that it is desirable to control the thickness of the SiO$_2$ film to between 0.01 to 0.1 of the thickness of the piezoelectric AlN film, but Yamamoto does not disclose the use of a very thin SiO$_2$ film to cover or embed the IDT structure, and in particular Yamamoto does not disclose the effect that this covering or embedding has now been discovered to have on the morphology and microstructure of the piezoelectric film produced in the region of the covered or embedded IDT structure.

Nakahata and Fujimori, in U.S. Pat. No. 5,160,869, entitled "SURFACE ACOUSTIC WAVE DEVICE" disclose a surface acoustic wave device which comprises a silicon substrate, a diamond or diamond-like carbon layer, a ZnO piezoelectric layer and a comb-like electrode. Nakahata and Fujimori additionally disclose surface acoustic wave devices of four types, which have these elements in different relative configurations. In two of these types, Type I and Type II, Nakahata and Fujimori disclose an arrangement in which the comb-like electrode is embedded between the diamond or diamond-like carbon layer and the piezoelectric layer.

Nakahata, Shikata, Hachigo, and Fujimori in U.S. Pat. No. 5,320,865 entitled "METHOD OF MANUFACTURING A SURFACE ACOUSTIC WAVE DEVICE" disclose a method of manufacturing a surface acoustic wave device which has a smaller insertion loss and which operates at higher frequency than a conventional surface acoustic wave device. In several of the configurations disclosed by Nakahata, Shikata, Hachigo, and Fujimori, they disclose interdigitated electrodes that are embedded between a diamond film and a ZnO film.

Imai, Nakahata, Hachigo, and Fujimori in U.S. Pat. No. 5,329,208 entitled "SURFACE ACOUSTIC WAVE DEVICE AND METHOD FOR PRODUCING THE SAME" disclose a surface acoustic wave device having a diamond layer, a piezoelectric layer and a comb-like electrode formed on the surface of the diamond layer, which surface has been contacted to a substrate used in the formation of the diamond layer by a vapor phase growth method. In several of the configurations disclosed by Imai, Nakahata, Hachigo, and Fujimori the comb-like electrodes have been embedded between the diamond layer and the piezoelectric layer.

A large number of additional patents have describe a variety of IDT structures and piezoelectric thin film combinations, many of which disclose structures in which the IDT structure is embedded. However, none of these patents disclose the use of a very thin interlayer or interlayers between IDT structure or the comb-like electrode structure, short-circuit ground planes, or other structures to enhance the morphology and microstructure of piezoelectric layers and films.

SUMMARY OF THE INVENTION

Taking such technical background as described above into consideration, the aim of the present invention is to provide acoustic wave devices on diamond or diamond-like carbon layers by the use of a very thin interlayer which covers the diamond or diamond-like carbon layers and under which any IDT or ground plane structures are embedded and covered. It has now been discovered that such a very thin interlayer improves and controls the morphology and structure of the piezoelectric layer deposited upon this very thin interlayer.

The interlayer has been discovered to provide a uniform nucleation layer for the subsequent deposition of the piezoelectric layer. The resulting multi-layer structure is improved such that damping of the amplitude of the acoustic wave is substantially reduced, and thus results in a low propagation loss.

OBJECTS OF THE INVENTION

It is an object of the invention to provide a surface and near-surface acoustic wave device structure using an interlayer on a diamond layer to embed or cover any IDT or ground plane structure.

It is still another object of the invention to provide in an acoustic wave device an interlayer that can produce a piezoelectric layer of uniform morphology and polarity.

It is another object of the invention to provide a structure which has the advantages of fabrication simplicity.

It is yet another object of the invention to enable low propagation loss and high electromechanical coupling piezoelectric layers to be formed on a nearly planar diamond surface.

It is still yet another object of the invention to provide an increase in the uniformity of the morphology of piezoelectric films.

ESSENTIAL FEATURES OF THE INVENTION

This invention discloses an interlayer and embedded IDT structure for acoustic wave devices, such as surface acoustic wave filters formed from a piezoelectric, an interlayer between the piezoelectric layer and an interdigitated electrode structure and between a piezoelectric layer and a diamond layer. Piezoelectric materials can be ZnO, Pb(Zr,Ti)O$_3$, (Pb,La)(Zr,Ti)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, and ZnSe as well as others. The vary thin interlayer materials can be Si, SiC, SiO$_2$, TiC, Si$_3$N$_4$, Al$_2$O$_3$, TiO$_3$, AlN, GaN, BN, and GaAs, as well as others. Piezoelectric materials can also be organic piezoelectric materials such as fluoride, polyvinylideneflouride, and copolymers of vinyl ideneflouride and trifluoroethylene, nylon 7, and nylon 11.

Because the IDT structure is embedded beneath the interlayer, the piezoelectric layer is not in direct contact with the IDT structure and instead the piezoelectric layer is in contact with an interlayer material of essentially uniform composition such that the crystal morphology with which the piezoelectric layer forms is of enhanced uniformity and concomitant polarity.

FIRST DETAILED DESCRIPTION

The present invention will now be described more fully hereinafter with reference to the accompanying drawing in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. In the drawings the thicknesses of layers are exaggerated for clarity.

Figure 1:
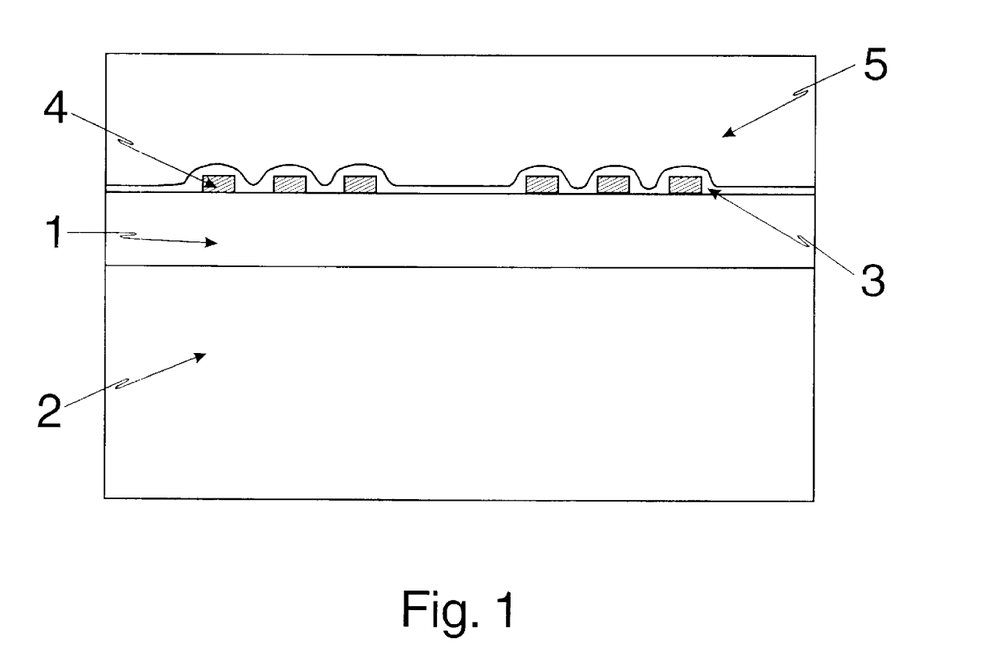
FIG. 1 is a sectional view showing the structure of a surface acoustic wave element according to a preferred embodiment of the present invention in which the IDT structure is separated from the piezoelectric layer by an interlayer.

According to the present invention, an acoustic structure includes a substrate, a diamond layer on the substrate, an interdigitated transducer (IDT) structure, and a very thin interlayer contacting both the diamond layer and the IDT structure and a piezoelectric layer formed upon the interlayer, whereby the IDT structure is embedded below the interlayer and the piezoelectric layer is formed on the interlayer. As shown in FIG. 1, an acoustic wave device for propagating surface acoustic waves is formed from a diamond layer (1) produced by the glow discharge decomposition of a carbon containing gas, such as methane diluted with hydrogen, where propagating a surface wave is understood to mean generating an acoustic wave, which may also be a standing wave. This diamond film is formed on a silicon substrate (2), and interdigitated transducer (IDT) electrodes (4) are formed by the deposition of a metal, preferably aluminum, onto the diamond layer (1) and subsequently patterned by standard photolithography; a very thin interlayer (3) of SiO$_2$ is then formed on the diamond layer (1) by chemical vapor deposition or by sputtering; the thin interlayer covers the interdigitated transducer electrodes (4) in order that the interdigitated transducer structure is essentially embedded between the diamond layer (1) and the interlayer (3) together. Only at those points where electrical contact is made to the interdigitated structure is the interdigitated structure not embedded. A piezoelectric layer (5) is subsequently formed by radio frequency magnetron sputtering of ZnO onto the interlayer (3). Other techniques, such as pulsed DC sputtering or chemical vapor deposition may also be used. To show piezoelectric behavior, this sputtered ZnO must be crystalline or polycrystalline and textured so that the c-axis of individual grains are substantially parallel to one another. It has now been discovered that this very thin interlayer between the diamond and the piezoelectric layer greatly increases the uniformity of the piezoelectric layer but does not interfere with the acoustic properties of a SAW device if the interlayer is between 10 Angstroms and 10,000 Angstroms in thickness, but preferably 50 to 100 Angstroms in thickness. It has additionally now been discovered that this very thin interlayer can itself be composed of amorphous, non-piezoelectric, very thin layers of materials such as ZnO, which would show piezoelectric behavior if they were crystalline or polycrystalline or textured so that the c-axis of individual grains are substantially parallel to one another.

Figure 2:
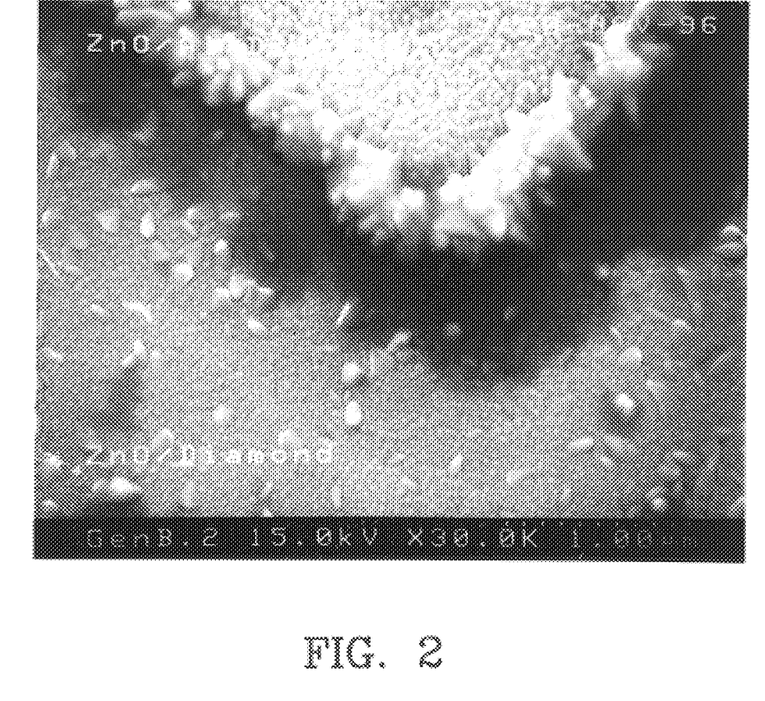
FIG. 2 is a scanning electron micrograph taken at a magnification of 30,000 times showing the change in the appearance of a ZnO layer in the region of an edge between a diamond layer and an aluminum metal layer compared to the appearance of a ZnO layer on diamond and a ZnO layer on an aluminum metal layer over diamond.
Figure 3:
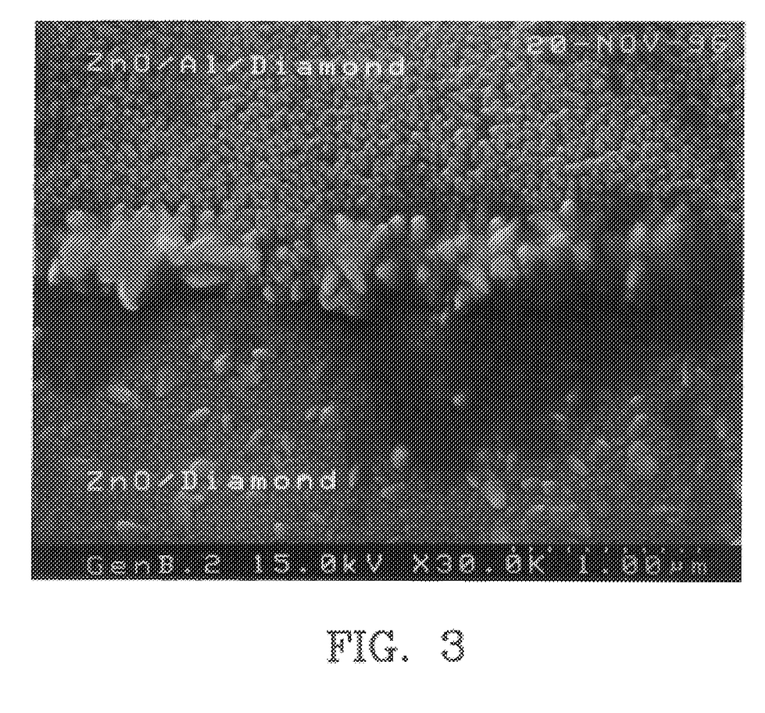
FIG. 3 is a scanning electron micrograph taken at a magnification of 30,000 times showing the change in the appearance of a ZnO layer in the region of an edge between a diamond layer and an IDT aluminum metal layer compared to the appearance of a ZnO layer on diamond and a ZnO layer on an aluminum metal layer over diamond.

As shown in FIG. 2, which is a scanning electron photomicrograph taken at a magnification of 30,000 times, the appearance of the ZnO layer deposited by radio frequency magnetron sputtering in the region of an edge between a diamond layer and an IDT metal layer reveals that the grains of the ZnO formed in this region are of a radically different morphology than the grains formed elsewhere. In this figure, the large grain morphology at the edge between the diamond and the aluminum appears as a jagged, white band and forming a V-shape in the upper portion of the photomicrograph. Propagation of acoustic waves across this jagged interface results in scattering of acoustic energy, and thus a deleterious reduction in the amplitude of the acoustic surface wave. In addition, the grain structure of the film deposited directly on the Al metal electrode differs from that deposited on the bare polycrystalline diamond film as is shown in FIG.

2 and FIG. 3. This non-uniformity also leads to scattering and thus reduction in the surface wave amplitude. Above this V-shape is shown the structure of the ZnO which is formed over the aluminum thin film layer which composes one finger of the IDT structure. Below this V-shape is shown the morphology of the ZnO which is formed directly on the diamond layer. As may be seen from this scanning electron micrograph, the morphology of the ZnO film that is formed directly on the diamond film consists of both small, relatively uniform grains of ZnO together with a distribution of larger, unevenly spaced larger grains of ZnO, and the large-grain material is not oriented in the preferred crystalline direction as compared to the fine-grain material. FIG. 3 is another example of the radical change in the crystal morphology of the ZnO film that forms at the edge between an aluminum metal film and a diamond film.

Figure 4:
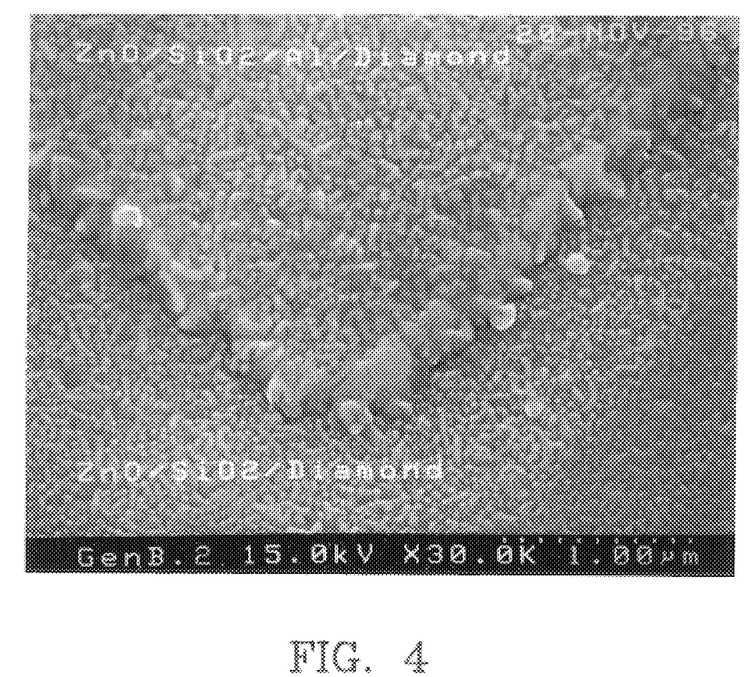
FIG. 4 is a scanning electron micrograph taken at a magnification of 30,000 times showing the appearance of a ZnO layer in the region of an edge between a diamond layer and an IDT aluminum metal layer when the ZnO layer is formed on the surface of a thin SiO$_2$ layer which covers the diamond and the aluminum metal layers.
Figure 5:
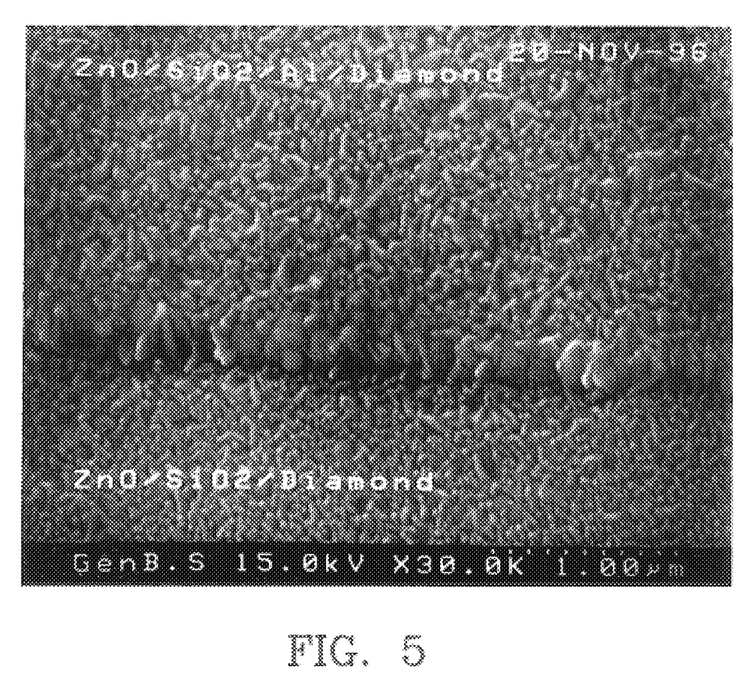
FIG. 5 is a scanning electron micrograph taken at a magnification of 30,000 times showing the appearance of a ZnO layer in the region of an edge between a diamond layer and an IDT aluminum metal layer when the ZnO layer is formed on the surface of a thin SiO$_2$ layer which covers the diamond and the aluminum metal layers.

FIG. 4 shows the appearance of a ZnO layer deposited by radio frequency magnetron sputtering in the region of an edge between a diamond layer and an IDT aluminum metal layer on a thin, approximately 500 Angstrom-thick interlayer of $SiO_2$ which covers both the diamond and the aluminum IDT metal layer. In this figure, the morphology of the ZnO film formed at the edge between the diamond and the aluminum forms a V-shape in the upper portion of the photomicrograph. Above this V-shape is shown the structure of the ZnO which is formed over the $SiO_2$ thin film interlayer which covers both the aluminum metal used to form the IDT structure and the diamond film. Below this V-shape is shown the morphology of the ZnO which is formed on the $SiO_2$ interlayer which covers the diamond layer. As may be seen from this scanning electron photomicrograph, the morphology of the ZnO film that is formed on the $SiO_2$ interlayer is uniform and furthermore that the ZnO film which forms in the region of the junction of the aluminum metal film and the diamond film is of greatly improved microstructure compared to that which is formed in the region of the junction of the aluminum metal film and the diamond film in the case where an intermediate $SiO_2$ interlayer film is not used. FIG. 5 is another example of the improvements which are gained in the uniformity of the ZnO film shown by the use of a thin $SiO_2$ film intermediate between the diamond film and the ZnO film and intermediate between the aluminum metal film and the ZnO film.

As shown by FIGS. 4 and 5, when compared with FIGS. 2 and 3, the appearance of the ZnO thin film layer in the region of the edge between a diamond layer and an IDT metal layer reveals that the grains of the ZnO formed in this region are much less differentiated when formed over the interlayer, and are more comparable with the grains formed over the interlayer in the region of the diamond layer and in the region of the metal IDT layer. The presence of the thin interlayer is thus found to have made the ZnO piezoelectric film more uniform in all locations.

SECOND DETAILED DESCRIPTION

Figure 6:
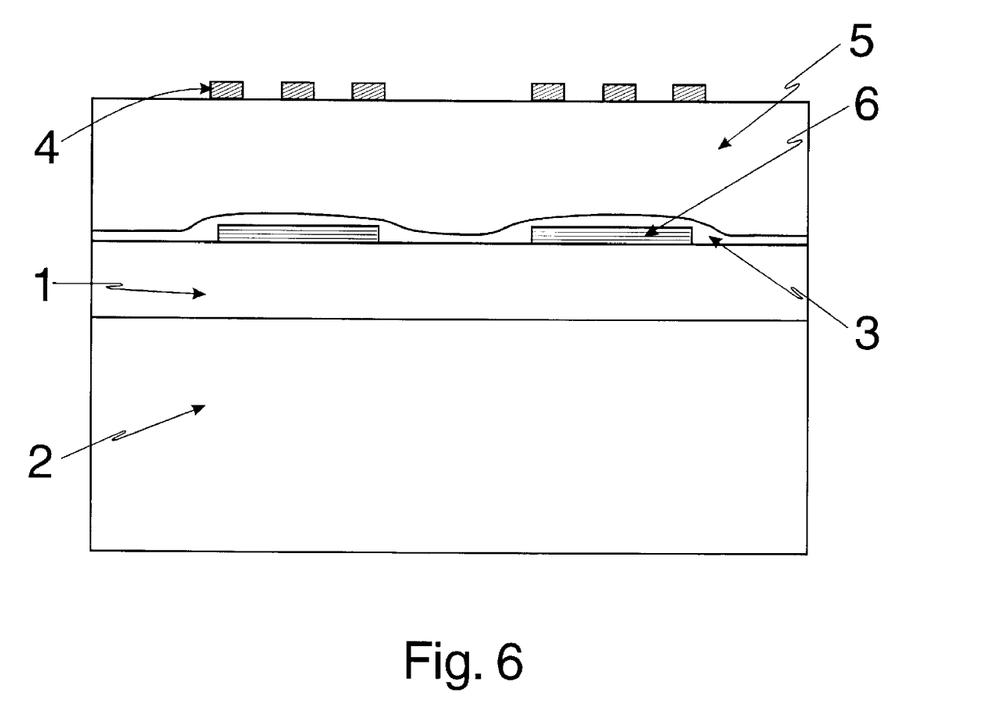
FIG. 6 is a sectional view showing the structure of a surface acoustic wave element with ground planes covered by an interlayer.

In a second detailed description of a preferred embodiment, a very thin interlayer (3) is applied over a ground plane which consists of a thin layer of metal, such as aluminum. Such a thin interlayer (3), typically less than one micron thick, is applied so that the IDT structure (4) is separated from the ground plane structure (6) by the piezoelectric film (5) that is applied over the interlayer (3), as shown in FIG. 6, so that the ground plane thin film structure is embedded between the diamond film (1) and the interlayer (3). It has now been discovered that the use of such an interlayer to embed the ground plane thin film structure results in improvements in the structure and granular uniformity of the piezoelectric layer (5) that is formed above the ground plane structure (6). One preferred material from which to form the interlayer is $SiO_2$.

The use of an interlayer is found to be especially effective in those regions of the piezoelectric layer near the region of the edge of the ground plane layer, but improvements in the uniformity of the granular structure of the piezoelectric layer are also found in regions removed from the edge of the ground plane structure compared to cases where the piezoelectric layer is formed on the ground plane structure without the use of an interlayer. Amorphous forms of the materials used for the interlayer have been discovered to be particularly favorable. Such amorphous interlayer materials include a-Si, a-SiC, a-$SiO_2$, a-TiC, a-$Si_3N_4$, a-$Al_2O_3$, a-$TiO_3$, a-AlN, a-GaN, a-BN, a- ZnO, a-Pb(Zr,Ti)$O_3$, a-(Pb,La)(Zr, Ti)$O_3$, a-LiTaO$_3$, a-LiNbO$_3$, a-Ta$_2$O$_5$, a-Nb$_2$O$_5$, a-BeO, a-Li$_2$B$_4$O$_7$, a-KNbO$_3$, a-ZnS, a-AlN, a-ZnSe and a-GaAs. In this designation of materials, the amorphous form is indicated by the use of a prefix, as in the term a-Si to indicate the amorphous form of Si, and similarly for the other substances.

Thus, a-Si is amorphous Si, a-SiC is amorphous SiC, a-$SiO_2$ is amorphous $SiO_2$, a-TiC is amorphous TiC, a-$Si_3N_4$ is amorphous $Si_3N_4$, a-$Al_2O_3$ is amorphous $Al_2O_3$, a-$TiO_3$, ia amorphous $TiO_3$, a-AlN is amorphous AlN, a-GaN is amorphous GaN, a-BN is amorphous BN, a- ZnO is amorphous ZnO, a-Pb(Zr,Ti)$O_3$ is amorphous Pb(Zr,Ti)$O_3$, a-(Pb, La)(Zr,Ti)$O_3$, is amorphous (Pb,La)(Zr,Ti)$O_3$, a-LiTaO$_3$, is amorphous LiTaO$_3$, a-LiNbO$_3$, is amorphous LiNbO$_3$, a-Ta$_2$O$_5$, is amorphous Ta$_2$O$_5$, a-Nb$_2$O$_5$, is amorphous Nb$_2$O$_5$, a-BeO is amorphous BeO, a-Li$_2$B$_4$O$_7$ is amorphous Li$_2$B$_4$O$_7$, a-KNbO$_3$ is amorphous KNbO$_3$, a-ZnS is amorphous ZnS, a-AlN is amorphous AlN, a-ZnSe is amorphous ZnSe and a-GaAs is amorphous GaAs.

The use of a thin interlayer has also been found to be effective in increasing the uniformity and morphology of piezoelectric thin films applied over diamond films or diamond-like carbon films even when no IDT or ground plane metal films are present on the diamond or diamond-like carbon film. As is shown in FIGS. 2 and 3, the morphology of the ZnO which is formed directly on the diamond layer consists of both small, relatively uniform grains of ZnO together with a distribution of larger, unevenly spaced grains of ZnO. FIGS. 4 and 5, show that the morphology of grains formed over the thin interlayer is of improved uniformity as compared to the grains of the piezoelectric film formed directly on the diamond. In arrangements in which the EDT structure is to be formed upon the outer surface of the piezoelectric film it has thus been found that even in this case the device benefits from the use of an interlayer formed upon the diamond or diamond-like carbon film and the piezoelectric film.

THIRD DETAILED DESCRIPTION

Figure 7:
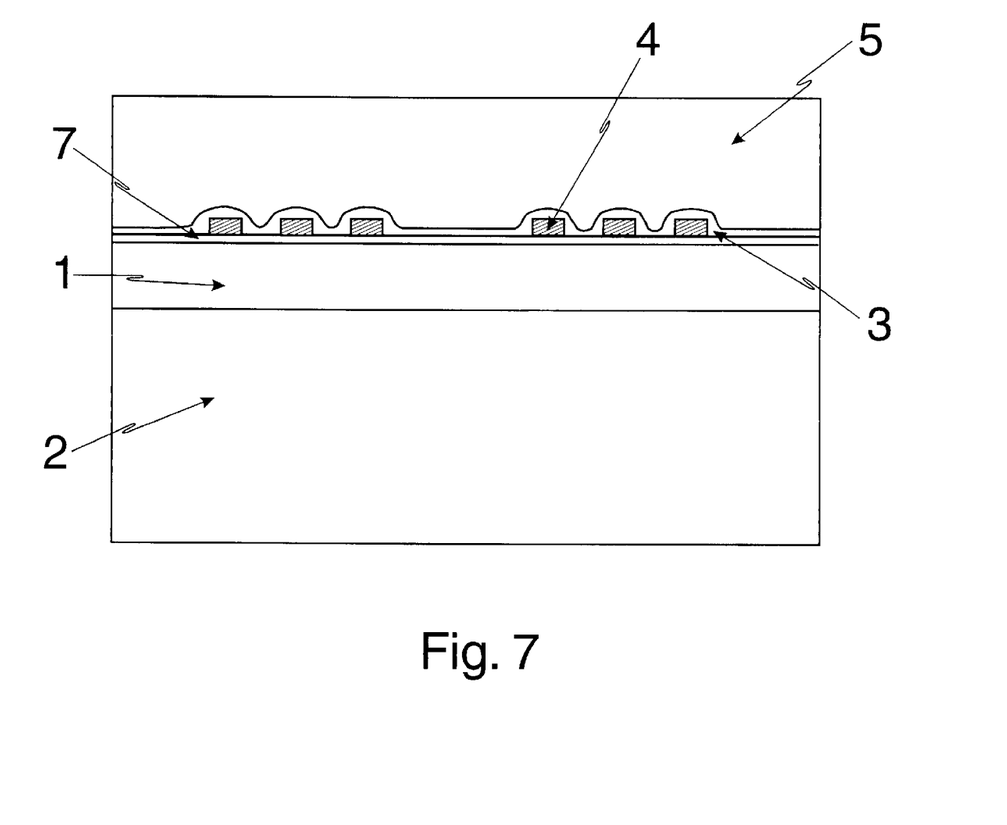
FIG. 7 is a sectional view showing the structure of a surface acoustic wave element with an IDT structure formed on a lower interlayer and covered by an upper interlayer.
Figure 8:
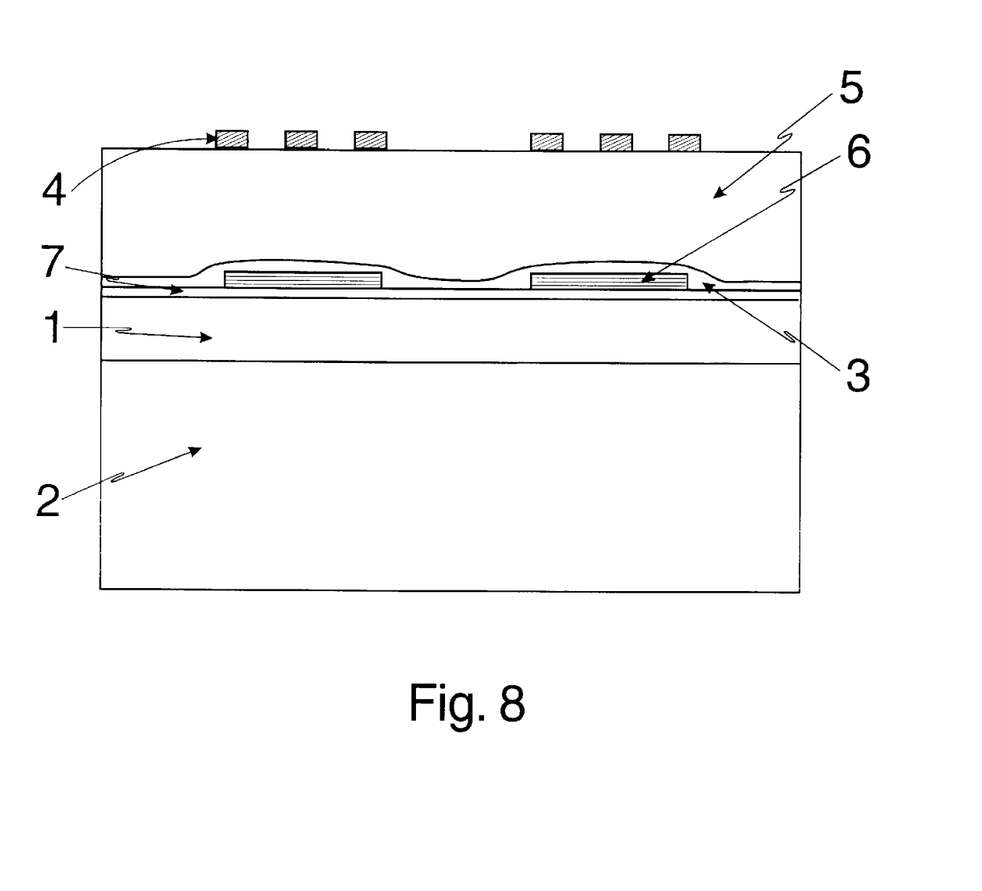
FIG. 8 is a sectional view showing the structure of a surface acoustic wave element with a ground plane formed on a lower interlayer and covered by an upper interlayer.

In a third detailed description of a preferred embodiment, a very thin lower interlayer structure (7) is applied over the diamond film (1) that has itself been formed on a substrate material (2), which is preferable crystalline silicon. Such a thin interlayer, is preferably less than one micron thick, and is applied so that the IDT structure (4) is separated from the diamond film (1) by the lower interlayer (7), as shown in FIG. 7. An upper interlayer film (3) is then made to cover both IDT structure and the regions of the lower interlayer that have not been covered by the IDT structure, so that the IDT structure is essentially embedded between the lower interlayer (7) and the second interlayer (3). It has now been discovered that the use of such multiple interlayers to embed the IDT structure entirely within the interlayer material except at those points needed to electrically contact the IDT structure results in improvements in adhesion of the IDT structure as well as being effective in increasing the uniformity and morphology of piezoelectric thin films. Such piezoelectric films are found to have improved structure and uniformity when applied over an interlayer interposed between the piezoelectric film and the diamond film or diamond-like carbon film and between the piezoelectric film and a ground plane metal film such as an aluminum film that is itself formed on a lower interlayer and is then covered by an upper interlayer as shown in FIG. 8. A preferred material from which to form the interlayers is $SiO_2$, whether crystalline $SiO_2$ or amorphous $SiO_2$ (a-$SiO_2$). Amorphous forms of the materials used for the interlayer have been discovered to be particularly favorable. Such amorphous interlayer materials include a-Si, a-SiC, a-$SiO_2$, a-TiC, a-$Si_3N_4$, a-$Al_2O_3$, a-$TiO_3$, a-AlN, a-GaN, a-BN, a-ZnO, a-Pb(Zr,Ti)$O_3$, a-(Pb,La)(Zr,Ti)$O_3$, a-$LiTaO_3$, a-$LiNbO_3$, a-$Ta_2O_5$, a-$Nb_2O_5$, a-BeO, a-$Li_2B_4O_7$, a-$KNbO_3$, a-ZnS, a-AlN, a-ZnSe and a-GaAs. In this designation of materials, the amorphous form is indicated by the use of a prefix, as in the term a-Si to indicate the amorphous form of Si, and similarly for the other materials.

We claim:

1. An acoustic wave device for propagating surface acoustic waves, comprising:
    a substrate;
    a diamond layer formed on said substrate;
    a lower interlayer formed on said diamond layer;
    interdigitated transducer electrodes formed on said lower interlayer;
    an upper interlayer covering said lower interlayer and said interdigitated transducer electrodes, whereby said interdigitated transducer electrodes are essentially embedded; and a piezoelectric layer on said upper interlayer.

2. An acoustic wave device for propagating surface acoustic waves, as set forth in claim 1, wherein said lower interlayer is between 10 Angstroms and 1000 Angstroms thick.

3. An acoustic wave device for propagating surface acoustic waves, as set forth in claim 1, wherein said upper interlayer is between 10 Angstroms and 1000 Angstroms thick.

4. An acoustic wave device for propagating surface acoustic waves, as set forth in claim 1, wherein said interlayer is $SiO_2$.

5. An acoustic wave device for propagating surface acoustic waves, as set forth in claim 1, wherein said piezoelectric layer is ZnO.

6. An acoustic wave device for propagating surface acoustic waves, as set forth in claim 1, wherein said interlayers are selected from the group consisting of Si, SiC, $SiO_2$, TiC, $Si_3N_4$, $Al_2O_3$, $TiO_3$, AlN, GaN, and BN.

7. An acoustic wave device for propagating surface acoustic waves, as set forth in claim 1, wherein said interlayers are selected from the group consisting of a-Si, a-SiC, a-$SiO_2$, a-TiC, a-$Si_3N_4$, a-$Al_2O_3$, a-$TiO_3$, a-AlN, a-GaN, a-BN, a-ZnO, a-Pb(Zr,Ti)$O_3$, a-(Pb,La)(Zr,Ti)$O_3$, a-$LiTaO_3$, a-$LiNbO_3$, a-$Ta_2O_5$, a-$Nb_2O_5$, a-BeO, a-$Li_2B_4O_7$, a-$KNbO_3$, a-ZnS, a-AlN, a-ZnSe and a-GaAs.

8. An acoustic wave device for propagating surface acoustic waves, comprising:
    a substrate;
    a diamond layer formed on said substrate;
    a lower interlayer formed on said diamond layer;
    a ground plane formed on said lower interlayer;
    an upper interlayer covering said ground plane and said lower interlayer layer, whereby said ground plane is essentially embedded;
    a piezoelectric layer on said upper interlayer; and
    interdigitated transducer electrodes formed on said piezoelectric layer.

9. An acoustic wave device for propagating surface acoustic waves, as set forth in claim 8, wherein said lower interlayer is between 10 Angstroms and 1000 Angstroms thick.

10. An acoustic wave device for propagating surface acoustic waves, as set forth in claim 8, wherein said upper interlayer is between 10 Angstroms and 1000 Angstroms thick.

11. An acoustic wave device for propagating surface acoustic waves, as set forth in claim 8, wherein said interlayers are $SiO_2$.

12. An acoustic wave device for propagating surface acoustic waves, as set forth in claim 8, wherein said piezoelectric layer is ZnO.

13. An acoustic wave device for propagating surface acoustic waves, as set forth in claim 8, wherein said interlayers are selected from the group consisting of Si, SiC, $SiO_2$, TiC, $Si_3N_4$, $Al_2O_3$, $TiO_3$, AlN, GaN, and BN.

14. An acoustic wave device for propagating surface acoustic waves, as set forth in claim 8, wherein said interlayers are selected from the group consisting of a-Si, a-SiC, a-$SiO_2$, a-TiC, a-$Si_3N_4$, a-$Al_2O_3$, a-$TiO_3$, a-AlN, a-GaN, a-BN, a-ZnO, a-Pb(Zr,Ti)$O_3$, a-(Pb,La)(Zr,Ti)$O_3$, a-$LiTaO_3$, a-$LiNbO_3$, a-$Ta_2O_5$, a-$Nb_2O_5$, a-BeO, a-$Li_2B_4O_7$, a-$KNbO_3$, a-ZnS, a-AlN, a-ZnSe and a-GaAs.

15. An acoustic wave device for propagating surface acoustic waves of the type wherein interdigitated transducer electrodes are produced on a diamond layer formed on a substrate, said acoustic wave device comprising,
    an interlayer formed on said diamond layer,
    said interlayer covering said interdigitated transducer electrodes and said diamond layer,
    whereby said interdigitated transducer electrodes are essentially embedded; and
    a piezoelectric layer formed on said interlayer,
    wherein said interlayer provides a nucleation layer promoting uniform orientation of said piezoelectric layer; and
    wherein said acoustic wave device has substantially reduced propagation loss.

16. An acoustic wave device for propagating surface acoustic waves, as set forth in claim 15, wherein said interlayer is $SiO_2$.

17. An acoustic wave device for propagating surface acoustic waves, as set forth in claim 15, wherein said piezoelectric layer is ZnO.

18. An acoustic wave device for propagating surface acoustic waves, as set forth in claim 15, wherein said interlayer is selected from the group consisting of Si, SiC, $SiO_2$, TiC, $Si_3N_4$, $Al_2O_3$, $TiO_3$, AlN, GaN, and BN.

19. An acoustic wave device for propagating surface acoustic waves, as set forth in claim 15, wherein said interlayer is selected from the group consisting of a-Si, a-SiC, a-$SiO_2$, a-TiC, a-$Si_3N_4$, a-$Al_2O_3$, a-$TiO_3$, a-AlN, a-GaN, a-BN, a-ZnO, a-Pb(Zr,Ti)$O_3$, a-(Pb,La)(Zr,Ti)$O_3$, a-$LiTaO_3$, a-$LiNbO_3$, a-$Ta_2O_5$, a-$Nb_2O_5$, a-BeO, a-$Li_2B_4O_7$, a-$KNbO_3$, a-ZnS, a-AlN, a-ZnSe and a-GaAs.

20. An acoustic wave device for propagating surface acoustic waves, as set forth in claim 15, wherein said piezoelectric layer is selected from the group consisting of ZnO, Pb(Zr,Ti)O$_3$, (Pb,La)(Zr,Ti)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, AlN, ZnSe and GaAs.

21. An acoustic wave device for propagating surface acoustic waves, as set forth in claim 15, wherein said interlayer has a thickness between 10 Angstroms and 1000 Angstroms.

22. An acoustic wave device for propagating surface acoustic waves of the type wherein ground planes are produced on a diamond layer formed on a substrate, comprising;

an interlayer formed on said diamond layer, said interlayer covering said ground plane and said diamond layer, whereby said ground plane is essentially embedded;

a piezoelectric layer on said interlayer, and interdigitated transducer electrodes formed on said piezoelectric layer, wherein said interlayer provides a nucleation layer promoting uniform orientation of said piezoelectric layer; and wherein said acoustic wave device has substantially reduced propagation loss.

23. An acoustic wave device for propagating surface acoustic waves, as set forth in claim 22, wherein said interlayer is SiO$_2$.

24. An acoustic wave device for propagating surface acoustic waves, as set forth in claim 22, wherein said piezoelectric layer is ZnO.

25. An acoustic wave device for propagating surface acoustic waves, as set forth in claim 22, wherein said interlayer is selected from the group consisting of Si, SiC, SiO$_2$, TiC, Si$_3$N$_4$, Al$_2$O$_3$, TiO$_3$, AlN, GaN, and BN.

26. An acoustic wave device for propagating surface acoustic waves, as set forth in claim 22, wherein said interlayer is selected from the group consisting of a-Si, a-SiC, a-SiO$_2$, a-TiC, a-Si$_3$N$_4$, a-Al$_2$O$_3$, a-TiO$_3$, a-AlN, a-GaN, a-BN, a-ZnO, a-Pb(Zr,Ti)O$_3$, a-(Pb,La)(Zr,Ti)O$_3$, a-LiTaO$_3$, a-LiNbO$_3$, a-Ta$_2$O$_5$, a-Nb$_2$O$_5$, a-BeO, a-Li$_2$B$_4$O$_7$, a-KNbO$_3$, a-ZnS, a-AlN, a-ZnSe and a-GaAs.

27. An acoustic wave device for propagating surface acoustic waves, as set forth in claim 22, wherein said piezoelectric layer is selected from the group consisting of ZnO, Pb(Zr,Ti)O$_3$, (Pb,La)(Zr,Ti)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe, AlN, ZnSe and GaAs.

28. An acoustic wave device for propagating surface acoustic waves, as set forth in claim 22, wherein said interlayer has a thickness between 10 Angstroms and 1000 Angstroms.

* * * * *